United States Patent

MacPherson et al.

[19]

[11] Patent Number: 6,078,091

[45] Date of Patent: Jun. 20, 2000

[54] INTER-CONDUCTIVE LAYER FUSE FOR INTEGRATED CIRCUITS

[75] Inventors: John MacPherson, Fremont; Alan H. Huggins, Gilroy, both of Calif.

[73] Assignee: Clear Logic, Inc., Santa Clara, Calif.

[21] Appl. No.: 09/186,307

[22] Filed: Nov. 4, 1998

Related U.S. Application Data

[62] Division of application No. 09/064,633, Apr. 22, 1998.

[51] Int. Cl.⁷ ..................................................... A01L 29/00
[52] U.S. Cl. ........................................... 257/529; 257/209
[58] Field of Search ...................... 257/529, 209

[56] References Cited

U.S. PATENT DOCUMENTS

| | | | |
|---|---|---|---|
| 4,383,165 | 5/1983 | Smith et al. | 257/529 |
| 4,536,949 | 8/1985 | Takayama et al. | 257/529 |
| 5,329,152 | 7/1994 | Janai et al. | 257/529 |
| 5,918,147 | 6/1999 | Filipiak et al. | 438/636 |

FOREIGN PATENT DOCUMENTS 62-119938  6/1987  Japan ..................................... 257/529

OTHER PUBLICATIONS

Full English Translation of Japan 62–119938, published Jun. 1987.

*Primary Examiner*—J. Carroll
*Attorney, Agent, or Firm*—Skjervern, Morrill, MacPherson, Franklin & Friel, LLP

[57] ABSTRACT

A method and structure for customizing or repairing integrated circuits using passivated tungsten fuses and low-power energy beams to select which tungsten fuses are to be removed. The tungsten fuses are formed in an array to connect possible connection points of the device. A low-power energy source then selects undesired connection points, and a conventional etch removes the selected tungsten fuses, thereby customizing or repairing the integrated circuit. Because neither precision custom masks nor high energy laser sources are required, the problems associated with conventional methods are reduced or eliminated.

7 Claims, 5 Drawing Sheets

INTER-CONDUCTIVE LAYER FUSE FOR INTEGRATED CIRCUITS

This application is a DIV of Ser. No. 09/064,633 filed Mar. 22, 1998.

BACKGROUND

1. Field of Invention

The present invention relates to the customization of electronic devices using radiant energy to configure interconnect structures, and more particularly to a compact arrangement of these structures and active circuitry on an integrated circuit.

2. Related Art

Custom or application-specific integrated circuits (ASICs) are frequently used to implement new circuit designs. The fabrication processes for an integrated circuit (IC) includes the following basic steps:

1) form a layer of conductive or insulative material on the upper surface of a silicon or semiconductor wafer;
2) coat the conductive or insulative layer with a photoresist (positive or negative), which is then cured and dried;
3) expose the photoresist (resist) to an intense light source through a precision mask to define specific patterns on the resist;
4) develop the resist to remove portions not selected by irradiation through the mask (exposed portions if a positive resist is used, unexposed portions if a negative resist is used);
5) etch away the portions of the conductive or insulative layer exposed by the removed portions of the resist;
6) remove the remaining resist;
7) repeat steps 1–6 for each layer formed on the IC.

One consequence of this fabrication process is that several precision custom masks may be required for each IC. Because precision custom masks are costly to manufacture, a large quantity of each IC must be produced in order for the fabrication process to be economical. However, as technology advances, circuit designs become more application-specific and are typically required at a much lower volume than the more generic ICs, thus making fabrication of such application-specific ICs more expensive. This need for lower cost-per-unit ASICs and other needs of the ASIC manufacturer and user are not being met with the conventional fabrication process.

The objectives of the ASIC user and manufacturer can be categorized into four primary areas. One objective is to feasibly manufacture a small number of prototype units (i.e., one or two units). This keeps the design costs low because only the required number of test units are manufactured, thereby saving costs for the unused and unneeded units. A second objective is to minimize the costs of each iterated test unit because a single application may require numerous prototype units for testing and modification. A third objective for the ASIC user is to reduce the lead-time to produce both prototype and production units so that the design can be developed and placed into production as soon as possible, thereby shortening the time-to-market schedule for the final circuit design. A fourth objective is to minimize costs for both prototype and production units, regardless of the number manufactured.

In an attempt to meet these objectives, a current practice is to use gate arrays to customize integrated circuits. Gate arrays are mass-produced integrated circuits containing generic arrays of circuit elements ("gate array blanks"), which can be customized into application-specific ICs with a small number of masks defining custom interconnections of the circuit elements at the final steps of fabrication. The gate array blanks can be manufactured up to the customization steps and stored away until an order for a particular application-specific circuit is received.

Typically, in a two-layer metal technology, customizing the gate array blank requires processing three layers: a first metal layer, an insulation layer, and a second metal layer, in that order. The basic steps are as follows:

1) deposit the first metal layer on a contact layer, which connects the first metal layer to the circuit elements below;
2) coat the first metal layer with resist, which is then cured and dried;
3) expose the resist through an application-specific mask;
4) develop the resist to remove the unwanted portions of the resist, i.e., the desired electrical connection portions;
5) etch the uncovered portions of the first metal layer;
6) remove the remaining resist;
7) deposit the insulation layer on the first metal layer;
8) coat the insulation layer with resist, which is then cured and dried;
9) expose the resist through a second custom mask;
10) develop the resist and remove the unwanted portions;
11) etch the uncovered portions of the insulation layer to form openings ("vias") in the insulation layer for connecting the first and second metal layers;
12) remove the remaining resist;
13) deposit the second metal layer on the insulation layer, allowing the deposited metal to fill the vias;
14) coat the second metal layer with resist, which is then cured and dried;
15) expose the resist through a third custom mask;
16) develop the resist to remove the unwanted portions;
17) etch the uncovered portions of the second metal layer;
18) remove the remaining resist;
19) deposit a passivation layer on the second metal layer; and
20) configure the passivation layer using a general purpose mask to provide connections for the ASIC thus formed.

Therefore, gate array processing reduces cost and lead-time to manufacture ASICs. However, even though gate array processing meets portions of the third and fourth objectives, the other objectives are not met due to the high costs of precision configuration masks. Furthermore, the need for precision configuration masks limits the extent that costs and lead-time can be reduced.

An alternative method is to use direct-write on wafer technology on gate array processing to replace the steps which require custom configuration masks. However, using programmable direct-write machines can still incur substantial costs to the manufacture of prototype and production ASICs. Electron beam (E-beam) direct-write technology employs high-cost equipment with a low throughput. On the other hand, laser-based direct-write systems do not have the resolution needed to meet the performance and total die size requirements of present designs. Even though less expensive than E-beam systems, laser-based systems are still more expensive and of lower precision than standard optical reduction steppers or other comparable methods using a standard set of precision photomasks.

Another alternative method for IC customization is to use arrays of radiant energy or laser-configurable fuses. In such methods, an array of laser fuses connects various inter-layer and intra-layer circuit elements. A radiant energy beam or laser then "blows" selected fuses to sever the electrical connection for circuit customization. Because the laser beam is applied directly to the fuses, the area above the fuses are commonly left open. It is also common for the area around and beneath the fuses to be free of active circuitry, i.e. transistors, resistors, signal lines, and junctions, to prevent the circuitry from being damaged from the heat of the radiant energy pulse. As a result, when compared with other conventional methods, the overall area of the integrated circuit increases and device density decreases since active circuitry cannot be placed underneath or near these fuses.

Device density is further limited when using conventional fuses because of minimum fuse length requirements. Since laser energy requirements are high, the fuse length in a fuse-programmable device is governed by the need to isolate the heat from the laser from the interconnect lines in contact with the fuse. If the fuse is too short, the heat may be transferred along the length of the fuse to the interconnect lines, resulting in possible damage to the lines.

Accordingly, it is desirable to customize integrated circuits without the drawbacks discussed above associated with conventional methods.

SUMMARY

According to the present invention, a method and structure are provided for customizing integrated circuits by using a low-power radiant energy beam combined with conventional etching techniques to selectively sever tungsten connection points, which eliminates both the need for costly custom precision masks during customization and the need to dedicate circuit-free areas on the device for thermal protection against a high-power radiant energy beam. In the present invention, after standard precision masks define possible connections on a device, a low-power radiant energy beam or laser selects the desired connection points for customization.

According to this invention, a metal or conductive layer is deposited on an insulating layer to provide connections with the circuit elements in lower layers of the electronic circuit. The conductive layer is patterned to provide metal lines with gaps at possible inter-layer connection points. An insulating or dielectric layer is then deposited on the conductive lines and patterned using a standard precision mask to provide openings above the possible connection points. In some embodiments, vias in the insulating layer are also formed at this step. Tungsten is then deposited to fill the possible connection points and the vias, thereby forming fuses and plugs, respectively.

Next, an upper metal or conductive layer is deposited over the exposed tungsten fuses and plugs and over the remaining areas of insulating layer. The upper conductive layer is covered with photoresist, patterned, and etched to form an upper set of conductive interconnect lines connected to the lower conductive layers by the tungsten plugs at the via locations. A film of protective dielectric film or other suitable material is then deposited over the interconnect lines, the tungsten fuses, and the insulating layer. This dielectric film is then patterned with photoresist and etched to uncover the tungsten fuses. Alternatively, this protective layer may be omitted. The exposed tungsten is next passivated, i.e., by forming a layer of oxidized tungsten on the surface of the fuses.

At this point, a low-power radiant energy or laser beam is used to ablate the oxidized tungsten over selected connection points which are to be severed or disconnected, while leaving the underlying tungsten portions intact. The tungsten fuses selected by the laser are then etched to remove the desired connections between the lower conductive lines, thereby customizing the device. The etch can be performed by hydrogen peroxide or other conventional etching techniques. Insulating material can be deposited to fill the gaps over the undesired connection points.

In other embodiments of the present invention, the selection of connection points which are to be disconnected can be performed by irradiation through a non-precision configuration mask, rather than a targeting energy beam. These embodiments follow the same processing steps as above up to and including forming the upper layer of patterned interconnect lines. In some embodiments, a layer of photoresist is next deposited over the interconnect lines, tungsten plugs, and insulating layer. Light through a non-precision custom mask selects the desired connection points which are to be disconnected. The resist is then removed at these areas to uncover the desired tungsten fuses. Subsequent conventional etching removes the tungsten and severs the desired connections. In other embodiments, a layer of oxide is deposited over the patterned interconnect lines prior to resist deposition. Exposure through a non-precision custom mask selects only possible connection points to be disconnected. After the selected areas of resist are removed, the areas of oxide uncovered by the resist are etched using conventional etch techniques. The remaining resist may then be removed and the uncovered tungsten fuses conventionally etched to disconnect the desired connection points and customize the device.

Accordingly, an IC can be customized without the use of a precision custom mask, and circuit elements can be placed closer together, thereby increasing device density, because a low-energy beam is used to customize the device.

The present invention will be more fully understood when taken in light of the following detailed description taken together with the accompanying drawings.

BRIEF DESCRIPTION OF THE DRAWINGS

Use of the same or similar reference numbers in different figures indicates same or like elements.

DETAILED DESCRIPTION OF THE PREFERRED EMBODIMENTS

The present invention provides a method and structure for fabricating a custom integrated circuit (IC) by the use of a low-power radiant energy beam without the need of a precision custom mask. The present invention uses standard precision masks to first define possible connections within a device and then uses a low-power radiant energy beam to selectively expose tungsten plugs, which are then etched to sever undesired connections and customize the IC.

Figure 1:
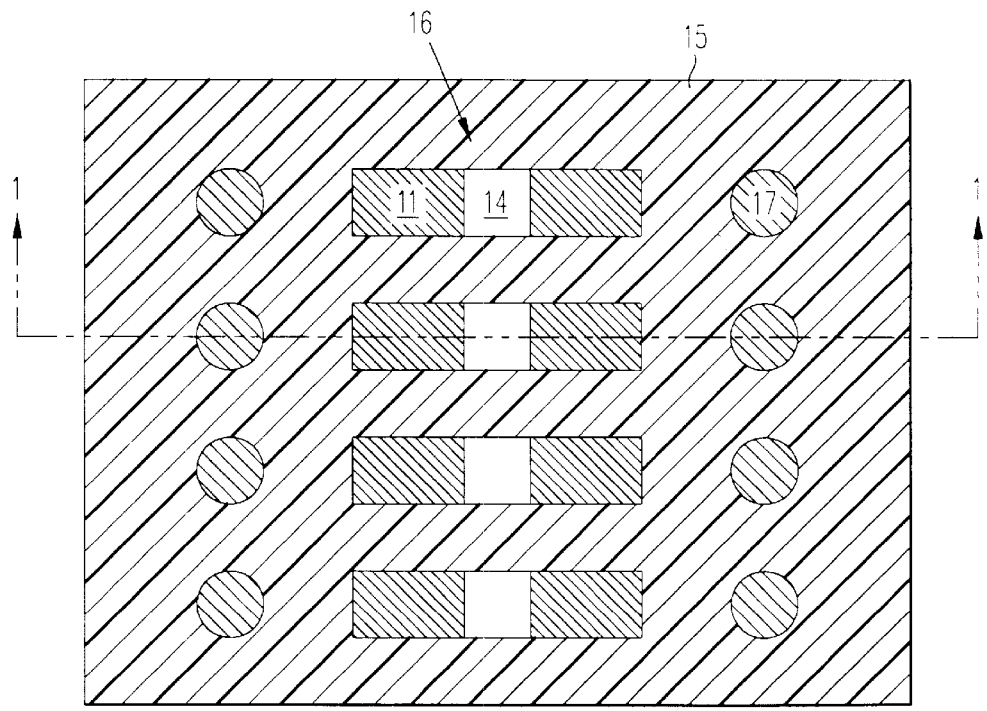
FIG. 1 is a top view of a set of patterned interconnect lines with possible connection points.
Figure 2:
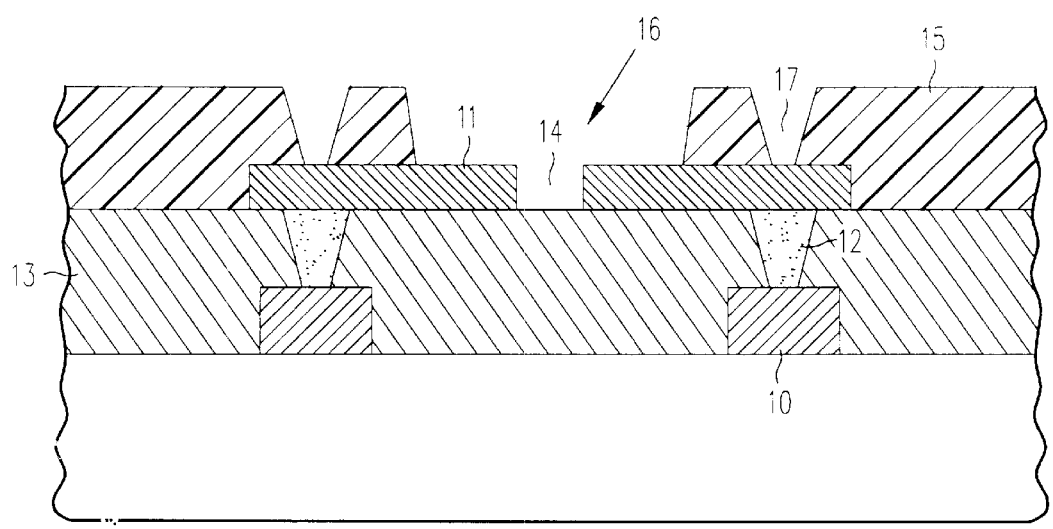
FIGS. 2–7 are side views of steps to customize an integrated circuit by selectively disconnecting desired connection points according to a method of the present invention.

FIGS. 1–7 illustrate one embodiment of the present invention for forming connections between patterned interconnect lines. FIG. 1 is a top view of a semiconductor structure having multiple patterned conductive and insulating layers formed by conventional processing methods. FIG. 2 is a side view along sectional line 1—1 of FIG. 1. A layer of patterned interconnect lines 10 provides connections with circuit elements in lower layers of the semiconductor structure or electrical circuit. Lines 10 are connected to overlying orthogonal conductive lines 11 by vias 12 extending through a dielectric or insulating layer 13. Conductive lines 11 are patterned with gaps at possible connection points 14. As shown, patterned interconnect lines 11 are formed over a conductive layer, with possible connection points within each line. However, as will be appreciated by those skilled in the art, possible connection points can be formed anywhere in the conductive layer. Another dielectric or insulating layer 15, formed over patterned interconnect lines 11, is patterned to create openings 16 over possible connection points 14. In some embodiments, vias 17 in insulating layer 15 are formed at the same time as the formation of openings 16. Patterning for the various layers of the structure of FIGS. 1 and 2 can be performed with standard precision masks or any other suitable method.

Figure 3:
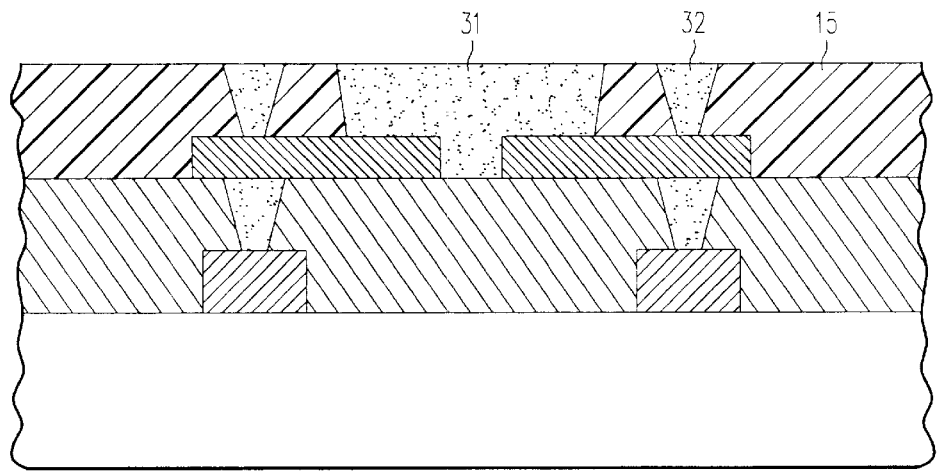
Figure 4:
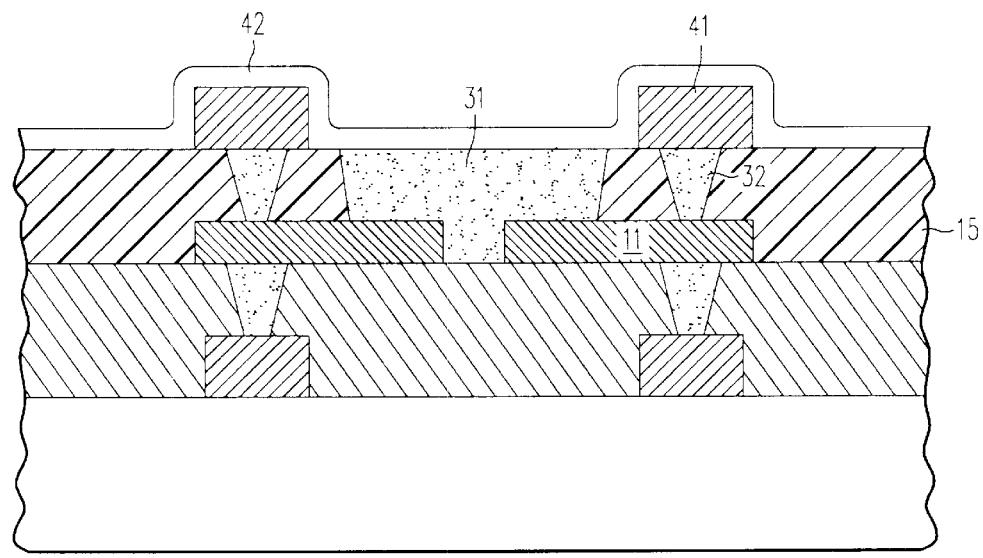

In FIG. 3, tungsten is deposited in openings 16 and vias 17, using either a selective tungsten deposition or a blanket tungsten deposition with etchback. As a result, tungsten fuses 31 connecting possible connection points within conductive lines 11 are formed in the possible connection points 14 in insulating layer 15, and tungsten plugs 32 are formed in the vias 17 in insulating layer 15. In FIG. 4, an upper conductive layer is then deposited over tungsten fuses 31 and plugs 32 and insulating layer 15 and then patterned to form upper conductive lines 41 which connect to conductive lines 11 through the tungsten plugs 32 at the via locations. A thin layer of dielectric 42 or other similar protective layer is then formed over upper conductive lines 41, insulating layer 15, and tungsten fuses 31, either by direct deposition or by deposition of a thicker layer of dielectric followed by a blanket etchback.

Figure 5:
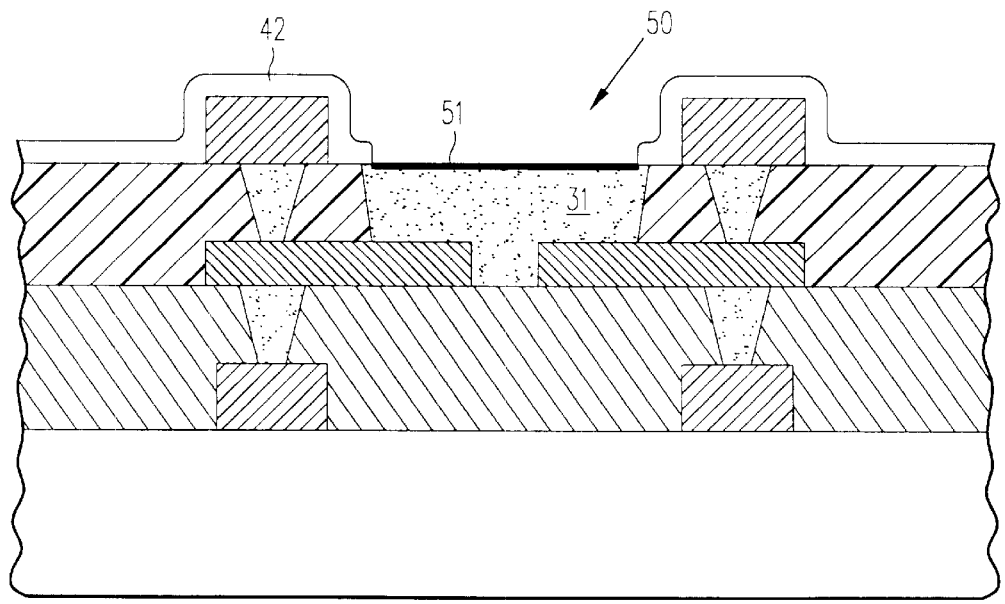

A layer of photoresist is then deposited on dielectric layer 42 and patterned to produce openings 50 in dielectric layer 42 over tungsten fuses 31. The areas of dielectric layer 42 left uncovered by the photoresist are then etched, which exposes the surface of tungsten fuses 31, and the remaining photoresist is removed, as shown in FIG. 5. In embodiments where the insulating or protective characteristics of dielectric layer 42 are not desired, the deposition and patterning of the layer 42 may be omitted.

The surface of the wafer is then exposed to oxygen and high temperature, such as a Rapid Thermal Process (RTP) or a diffusion tube using an oxygen gas, to oxidize the exposed surfaces of tungsten fuses 31 at the connection points to be severed or disconnected, resulting in a layer of tungsten oxide 51 functioning as a passivation layer for the underlying tungsten. The wafer is then diced, and the die may be installed in packages, with no lid such that the die can be accessed. In other embodiments, processing continues without packaging, which eliminates restrictions on certain etch techniques that may damage the packaging materials.

Figure 6:
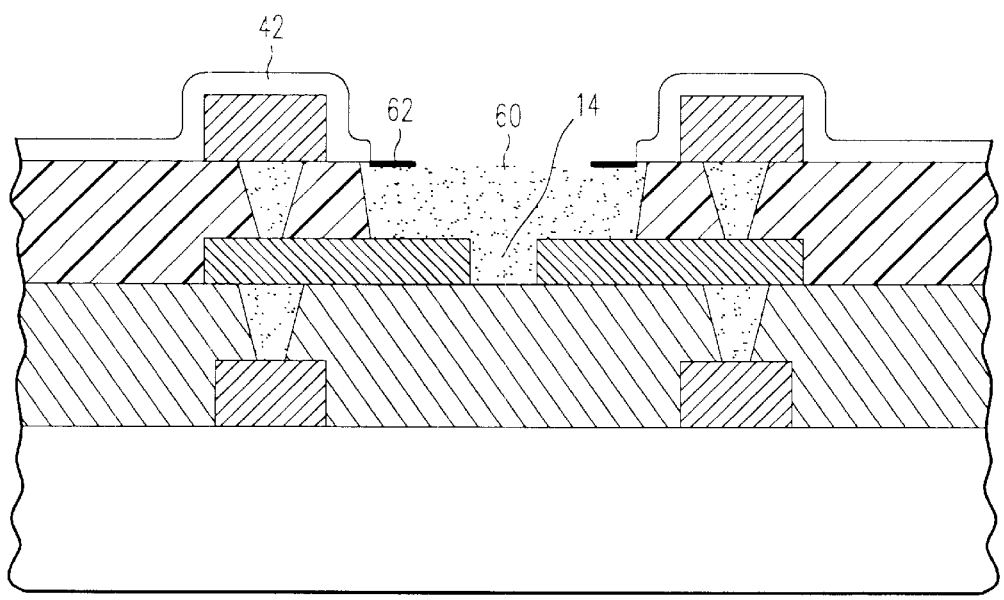

In FIG. 6, a low-power targeting energy beam, such as a laser, first selects undesired connection points 60 (i.e., connections to be severed or disconnected) by ablating the tungsten oxide from all undesired connection points, while leaving desired connection points unexposed to the energy beam. Note that the targeting energy beam need only expose an area over possible connection point 14 and not the entire tungsten fuse 31, so that unablated oxidized tungsten areas 62 can remain after the energy beam exposure. A low-power energy beam can be used because the energy required to ablate a layer of tungsten oxide is much lower than that required to blast a conventional laser fuse which might commonly be used. In addition, the beam energy is lower than the energy required to significantly change the physical state of the underlying tungsten, which acts as a heat sink and beam barrier to the underlying circuitry. In other embodiments, a standard photomasking process replaces the tungsten oxidation and targeting energy beam steps. By combining two steps into a single step, a higher throughput, and therefore a lower cost, is possible.

Figure 7:
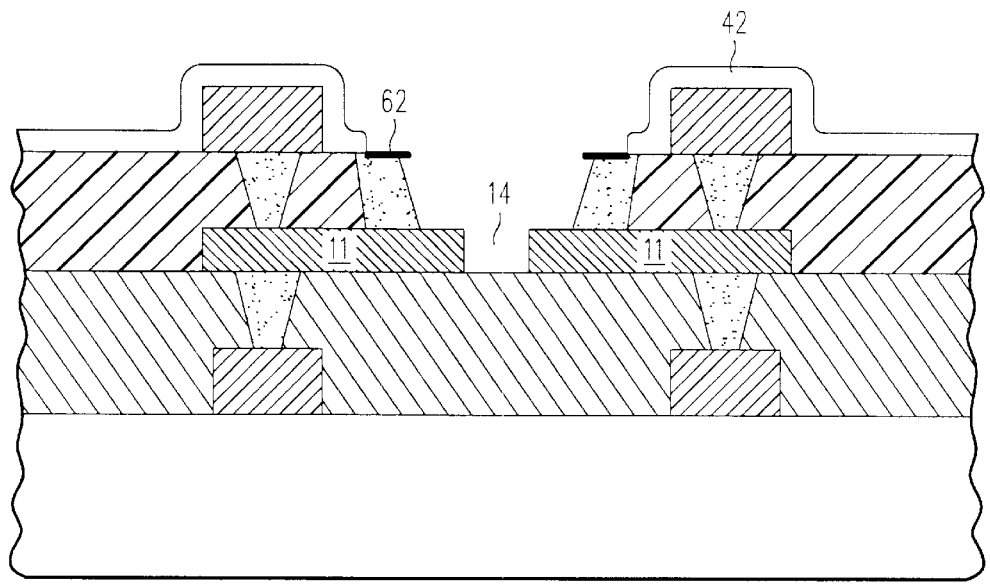

After the tungsten oxide over undesired connection points 60 have been ablated by the targeting energy beam, the underlying tungsten can be etched using conventional etching techniques, such as immersion in hydrogen peroxide. This will etch the tungsten over the undesired connection points, but not the oxidized tungsten 62 or dielectric layer 42, as shown in FIG. 7. As a result, selected tungsten fuses are removed, thereby severing or disconnecting undesired connection points and customizing the structure. A layer of insulating material (not shown), such as epoxy, can then be deposited to insulate the exposed gaps within metal lines 11.

In other embodiments of the present invention, other compounds of tungsten, such as tungsten nitride, or other materials may be deposited or formed on the surface of the tungsten fuses to act as the passivation layer in place of the tungsten oxide. Properties of the passivation layer include being ablatable by a radiant energy beam at relatively low energies and having a much lower etch rate relative to tungsten in the medium used for the removal of the underlying tungsten.

In another embodiment of the present invention, an adhesion metal, such as titanium-tungsten, can be deposited prior to the tungsten deposition. This film provides better adhesion and lower resistance of the tungsten at the connection point to the underlying patterned interconnect layer, but may still be etched using the same wet or dry etch chemistry as is used for the tungsten.

Figure 9:
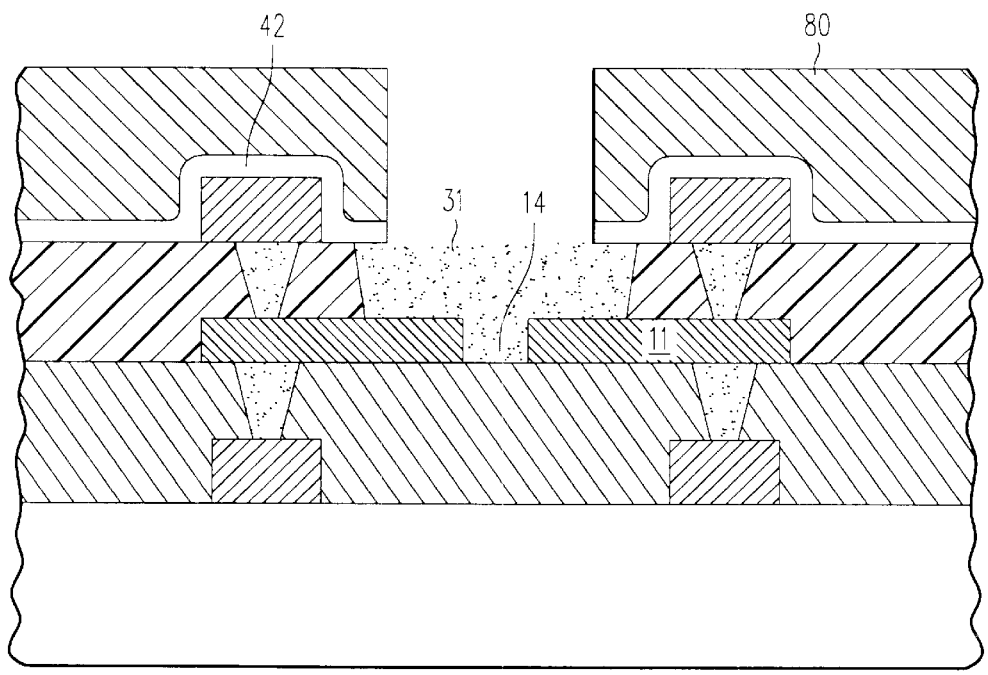
FIGS. 8 and 9 are side views of steps to customize an integrated circuit according to another embodiment of the present invention using a non-precision masking process.
Figure 8:
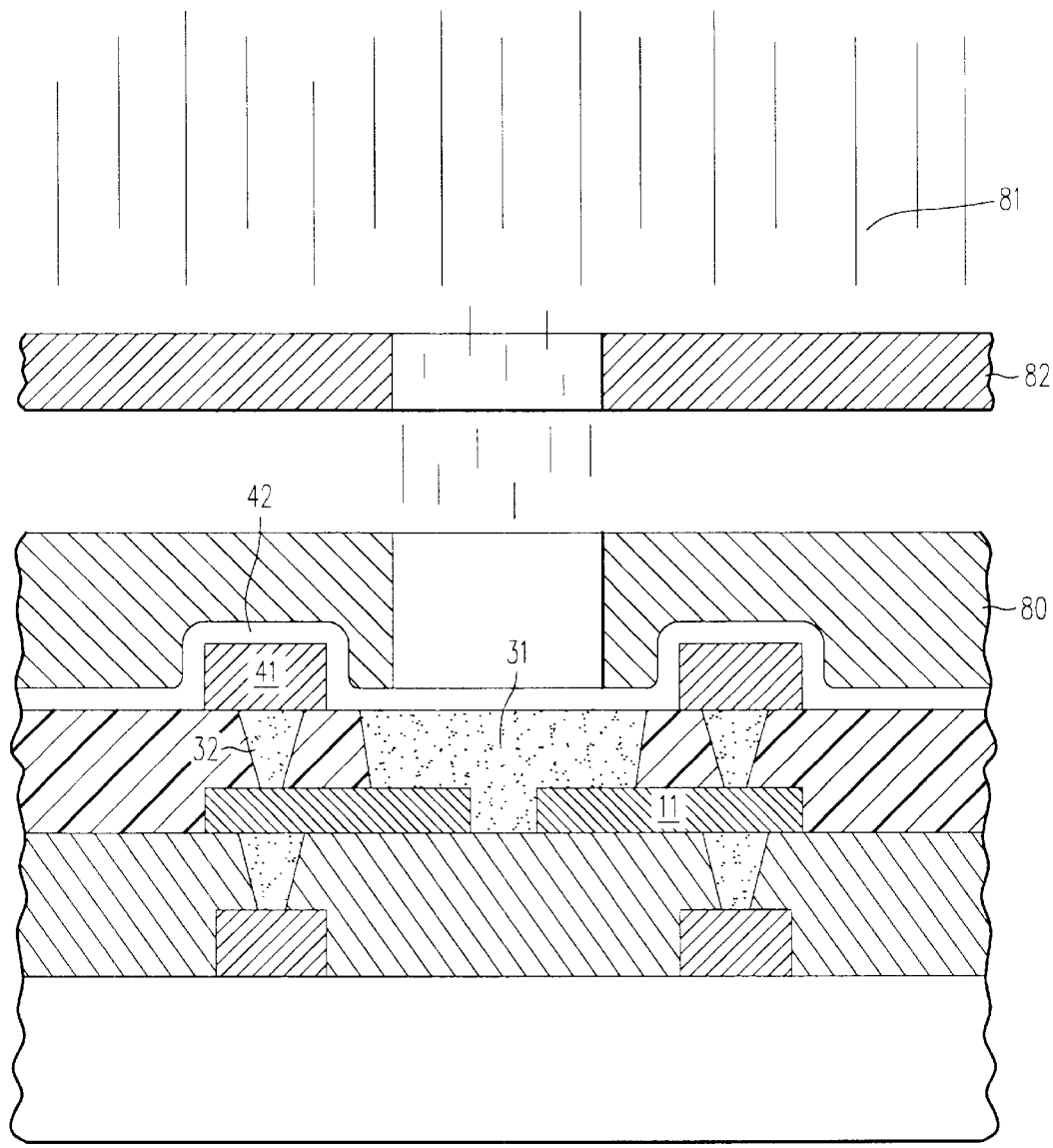

FIGS. 8 and 9 show another embodiment of the present invention, where a non-precision masking step replaces the use of a low-power targeting energy beam for selecting the undesired connection points. In FIG. 8, after tungsten is deposited in the possible connection points 14 and vias 17 (FIG. 2) to form fuses 31 and plugs 32, respectively, patterned interconnect lines 41 are formed over tungsten plugs 32. A thin layer of dielectric 42 or other suitable material is formed on the wafer surface as with previous embodiments; however, in other embodiments using the non-precision mask, formation of the dielectric can be skipped. A layer of photoresist 80 is then deposited on the wafer surface and exposed by a light source 81 through a non-precision configuration mask 82. As with configuration with the low-power laser, irradiation through non-precision mask 82 is only required to select areas over the connection points 14 to be disconnected and not the entire tungsten fuse 31. Therefore, because precision requirements are relaxed, the costs and manufacture time of non-precision mask 82 are reduced. Note that although FIG. 8 shows photoresist 80 being a positive polarity, either positive or negative resist can be used during this or any other resist patterning steps, using appropriate image reversal with the standard precision masks, targeting energy beams, and non-precision configuration masks, to obtain the same desired patterns and connection points. Such modifications are well known to those skilled in the art.

After irradiation through non-precision mask 82 selects connection points 14 to be severed, photoresist 80 is developed to remove the selected portions of photoresist 80, as shown in FIG. 9. Uncovered portions of dielectric layer 42 over tungsten fuse 31 are then etched at the undesired connection points. The remaining portions of photoresist 80 may then be removed if desired. The underlying tungsten is removed by wet or dry etching to sever the electrical connection at connection point 14. In other embodiments, a single etching process is used to remove both the uncovered portions of dielectric layer 42 and the underlying tungsten. In the embodiments without dielectric layer 42, the tungsten can be etched directly after photoresist 80 is patterned to remove the connections at the undesired connection points.

Thus, by using passivated tungsten fuses or fuses covered by resist, which allows fuse selection with low-power energy beams, the present invention provides numerous advantages over conventional IC customization and repair techniques. By reducing the minimum power requirements for fuse selection, device density can be increased. The low power requirements of the targeting energy beam in the present invention permit circuitry to be fabricated around and underneath the impingement points of the beam without causing damage to the circuitry. Furthermore, the low power delivered to the structure allows the length of the interconnect lines with possible connection points to be shortened as compared with the length of conventional fuses. As a result, the size of the device can be decreased and/or the packing density increased over devices made with conventional fuses.

Further advantages are provided because costly precision custom masks are eliminated. The cost of the manufacturing process is reduced, since inexpensive non-precision configuration masks can be used to customize a circuit instead of expensive precision custom masks, and simple, non-critical wet etches are used instead of the more expensive plasma etching techniques. In addition, laser positioning accuracy can be reduced over conventional laser fuse methods because the laser beam need only impinge over the area of the connection point and not the entire surface of the fuse, which translates into less expensive and complex laser targeting systems.

The present invention also allows devices to be customized either individually or at the package level. The cost per device of small orders becomes more economically feasible because the devices can be programmed independently of the wafer without the need of individual custom precision masks. Further, NRE costs, waste for the manufacturer, and lead-time for prototype production are reduced. An extremely short lead time is required to produce prototype parts, since the customization can be performed in the package in a short number of hours.

In addition to improving customization, this invention may also be used to improve the repair of integrated circuits. Laser fuses, which are commonly used as repair elements, may be replaced with possible disconnection points formed of tungsten and a passivation layer on lines spaced at the minimum attainable conductor pitch even with larger laser beam spot sizes. As such, benefits similar to those discussed above are possible when utilizing this invention to repair circuits.

The above-described embodiments of the present invention are merely meant to be illustrative and not limiting. It will thus be obvious to those skilled in the art that various changes and modifications may be made without departing from this invention in its broader aspects. For example, a single custom mask with only the desired connections could be substituted for the standard mask that defines all possible interconnections and the non-precision configuration mask or targeting energy beam that selects the desired connection points. Also, the above embodiments describe mainly using tungsten as the metal connecting material, but other metallic materials could be used which exhibit similar etching properties. Therefore, the appended claims encompass all such changes and modifications as fall within the true spirit and scope of this invention.

What is claimed is:

1. A structure for customizing or repairing an integrated circuit by electrically disconnecting circuit elements, comprising:

a fuse body electrically connecting at least two of said circuit elements, wherein said fuse body comprises a conductive metal; and a passivated conductive metal layer formed from the upper surface of said fuse body, wherein a low power energy source impinges on said passivated conductive metal layer to ablate said passivated conductive metal layer to expose said fuse body for etching.

2. The structure of claim 1, wherein said conductive metal is tungsten.

3. The structure of claim 1, wherein said passivated layer is an oxidized layer of said conductive metal.

4. The structure of claim 3, wherein said passivated layer is an oxidized layer of said fuse body.

5. The structure of claim 2, wherein said passivated conductive metal layer consists of tungsten and oxide.

6. The structure of claim 5, wherein said tungsten oxide layer is formed from said fuse body.

7. The structure of claim 1, wherein said passivated layer overlies only said fuse body.

* * * * *